United States Patent
Michaelis et al.

[11] Patent Number: 6,103,585
[45] Date of Patent: Aug. 15, 2000

[54] METHOD OF FORMING DEEP TRENCH CAPACITORS

[75] Inventors: Alexander Michaelis, Wappingers Falls; Rajiv Ranade, Fishkill; Bertrand Flietner, Hopewell Junction, all of N.Y.

[73] Assignee: Siemens Aktiengesellschaft, Munich, Germany

[21] Appl. No.: 09/093,801

[22] Filed: Jun. 9, 1998

[51] Int. Cl.[7] .................................................. H01L 21/20
[52] U.S. Cl. ........................................... 438/386; 438/714
[58] Field of Search ..................................... 438/386, 714

[56] References Cited

U.S. PATENT DOCUMENTS

| 4,726,879 | 2/1988 | Bondur et al. | |
|---|---|---|---|
| 4,855,017 | 8/1989 | Douglas | 156/643 |
| 5,605,600 | 2/1997 | Muller et al. | 156/643.1 |
| 5,662,768 | 9/1997 | Rostoker | 257/301 |

FOREIGN PATENT DOCUMENTS

| 0 511 488 A1 | 4/1991 | European Pat. Off. . |
| 06-310655 | 11/1994 | Japan . |
| WO 96/08036 | 3/1996 | WIPO . |

*Primary Examiner*—Charles Bowers
*Assistant Examiner*—Evan Pert
*Attorney, Agent, or Firm*—Stanton C. Braden

[57] ABSTRACT

A vertical trench in a silicon wafer for use in forming the storage capacitor of a DRAM is etched by reactive ion etching in a manner to have a profile that has multiple waists. This profile is obtained by varying the rate of flow of coolant in the base member on which the silicon wafer is supported during the reactive ion etching to vary the temperature of the silicon wafer during the etching. Alternatively, the multiple waists are achieved by either by varying the ratio of the different gases in the etching chamber or the total gas pressure in the chamber.

2 Claims, 1 Drawing Sheet

METHOD OF FORMING DEEP TRENCH CAPACITORS

FIELD OF INVENTION

This invention relates to the structure and method of fabrication of a capacitor, and more particularly, to a storage capacitor that serves as the storage capacitor of a dynamic random access memory (DRAM) cell.

BACKGROUND OF THE INVENTION

The basic DRAM memory cell currently being widely used includes a storage capacitor connected in series with a switch that is typically a field effect transistor (FET). A popular form of the transistor is a metal-oxide-silicon field effect transistor (MOSFET) that has a drain (an input/output), a source (an input/output), and a gate. As the capacity of a DRAM has grown, it has become necessary to use smaller and smaller components packed closer and closer. To maintain a good signal-to-noise ratio, it becomes important to keep the capacitance of the storage capacitor relatively high. A popular form of capacitor to achieve a high capacitance without using excessive chip surface area is the trench capacitor, which comprises a trench that extends vertically from the top surface of the silicon chip deep into the chip. This trench is first lined with a dielectric film to serve as the capacitor dielectric, and is then filled with doped polysilicon. The doped polysilicon serves as a plate and the storage node of the capacitor and as such, is connected to one input/output terminal (drain/source) of the MOSFET. The bulk of the silicon chip serves as the other plate of the capacitor and typically is connected to one terminal of a voltage supply source used with the DRAM. The other input/output terminal (source/drain) of the MOSFET is connected to a bit line of the DRAM. Logic information that is stored in the memory cell as charge on the storage capacitor is read into or out of a memory cell via the bit line. The gate of the MOSFET, which controls conduction through the MOSFET, is connected to a word line of the DRAM.

To increase the capacitance, the trend has been to extend the trench deeper and deeper into the silicon chip to increase the plate surface area of the capacitor and so the effective capacitance.

One of the problems that arises in the etching of a trench is deterioration of the mask that is deposited over the top surface of the chip to define the surface area to be etched. The rate of mask deterioration depends on the temperature of the wafer involved in the etching process and there is a limit to the amount of heating that can be safely withstood by the mask without excessive deterioration. This is sometimes described as the thermal budget of the mask.

One technique that has been proposed to increase the capacitance has been to flare the trench into a bottle shape once it breaks through the active upper region of the chip to increase the plate area without adding commensurately to the chip surface area occupied.

The present invention seeks to use the thermal budget more efficiently than has been done in the past so as to increase the capacitance that can be obtained from a trench capacitor.

SUMMARY OF THE INVENTION

We have discovered that it is possible to increase the capacitance of a trench capacitor by providing a trench that has a multi-waist profile.

We have further discovered that it becomes feasible to increase the depth of the trench that can be etched without excessive deterioration of an etch mask by varying the temperature of the wafer. This is done by changing the pressure of the coolant used to cool the backside of the wafer. Moreover, such temperature varying results in an increased capacitance for the trench, not only by increasing the depth of the trench that can be safely formed, but also by providing an undulating surface for the side walls of the trench. Each of these factors effects an increase in the total surface area of the capacitor plates, and so the capacitance provided.

Typically, during the etching, the silicon wafer is supported on a base plate, or chuck, that is channeled to permit the flow of cooling gases therethrough for cooling the supported silicon wafer. A convenient way for realizing the desired temperature variation is simply by changing appropriately the rate of flow of the coolant, typically helium, thorough the base plate, the higher the flow the higher the cooling efficiency.

Also since the diameter of a trench that is being etched is dependent both on the temperature T of the wafer during the etching, the ratio of the gases in the gaseous mixture, or the pressure of the gaseous mixture in the chamber used for etching, the invention also contemplates variation of any of these parameters during the etching to get the desired multiple waist profile.

In accordance with a broad process aspect, the present invention is a process of reactive ion etching of a vertical trench in a silicon wafer that includes supporting a silicon wafer in an etching chamber through which is flowed a gaseous mixture including at least one species that provides reactive ions suitable for etching and at least one species that serves as an enhancement to the formation of deposits on the etched trench walls. The process further comprises the step of varying the diameter of the trench as the etching proceeds by varying at least one of, the temperature of the wafer, the ratio of the two species and the gaseous pressure in the chamber, whereby there results a vertical trench in the wafer that has multiple waists.

In accordance with a preferred process aspect, the present invention is a process of reactive ion etching of a silicon wafer that includes supporting a silicon wafer in an plasma etching chamber through which is flowed a gaseous mixture including at least one species that provides reactive ions suitable for etching and one species that serves as an enhancement to the formation of a trench wall coating. The process further comprises the step of varying the temperature of the silicon wafer during the reactive ion etching process whereby there results a vertical trench in the silicon wafer that is deeper and has a larger surface area than can be achieved by maintaining the silicon wafer at essentially a uniform temperature for the same thermal budget during the etching process.

In accordance with the product aspect, the present invention is directed to a trench capacitor for use as the storage capacitor in a memory cell characterized in that its profile has multiple waists. Typically the profile has two waists.

The invention will be better understood from the following more detailed description taken with the accompanying drawing.

The drawings are not necessarily to scale.

DETAILED DESCRIPTION

Figure 1:
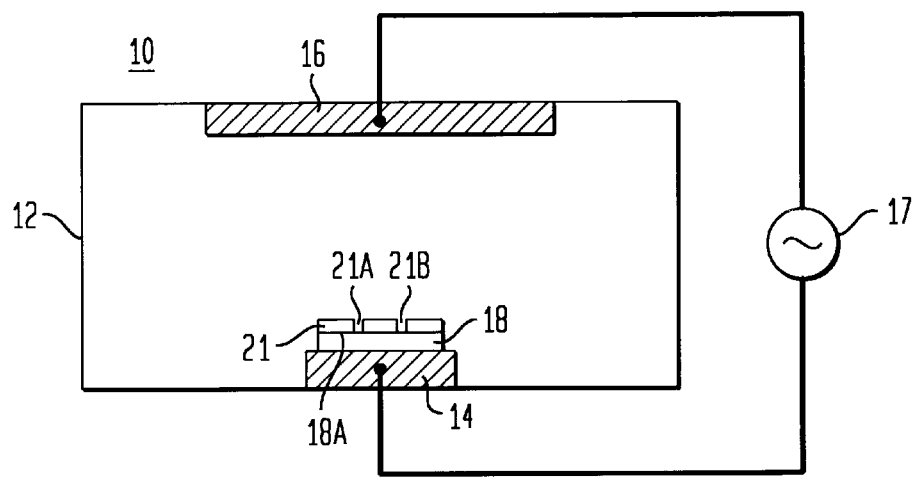
FIG. 1 shows the basic structure of etching apparatus useful with the present invention.

With reference now to FIG. 1, there is shown etching apparatus 10 which comprises an etching chamber 12 in which are contained an electrostatic base (chuck) 14 on a lower surface and a gas distribution plate 16 on an upper surface. Base 14 and plate 16 are essentially parallel to each other and form first and second electrodes, respectively. An R-F generator 17 is coupled between base 14 and plate 16. With appropriate gases introduced into chamber 12 there is generated therein an R-F glow discharge reaction. Chamber 12 is typically formed from aluminum oxide.

A workpiece 18, typically a silicon wafer, to be etched is positioned and supported on the metallic base plate (chuck) 14. On a top surface 18A of silicon wafer 18 is a mask 21 which has apertures 21A and 21B through which are exposed portions of surface 18A of wafer 18 at which trenches are to be formed. Only two apertures for two trenches are shown for illustrative purposes. Typically, the wafer 18 is monocrystalline and has its top surface 18A cut along the 100 crystallographic plane. The R-F glow discharge reaction within chamber 12 creates a plasma that creates the reactive ions that are responsible for the etching. The thickness of the mask 21 typically is several thousand Angstroms. It becomes impractical to increase the thickness much beyond this and still achieve the definition desired for state of the art integrated circuits, such as dynamic random access memories (DRAMS).

Additionally, typically coils (not shown) surround the chamber 12 to create a magnetic field in the chamber that is perpendicular to the electric field associated with the R-F discharge. This is known to increase the effectiveness of the reactive in etching and is generally employed with reactive ion etching equipment of the type shown in FIG. 1. However, it may be unnecessary with other reactive etching equipment.

The gaseous mixture typically is supplied by an inlet (not shown) at the top of the chamber 12 into the top electrode 16 that is apertured (not shown) in a fashion to disperse the gas exiting from it. The spent gases are exhausted at vents (not shown) in the bottom of the chamber 12. Typically, the gaseous mixture includes hydrogen bromide (HBr), nitrogen trifluoride ($NF_3$), and helium-oxygen (He-$O_2$), about which more is said below.

The base plate 14 is provided with channels (no shown) through which is passed a cooling gas, typically helium. Inlets and outlets (both not shown) are used to flow the helium through the plate 16. This gas serves to cool the backside of the wafer 18. The flow rate of the cooling gas is used to control the temperature of the silicon wafer 18 and also is the principal mechanism used for controlling the rate and degree of anisotropy at which the trenches are being etched and, correspondingly, the profile of the trench being etched. The warmer the silicon wafer, the faster the etching.

As is known, in a reactive ion etching process of the kind here involved, reactive ions in the plasma formed by the r-f discharge react with the silicon to convert the silicon to a gaseous silicon compound that is exhausted. At the same time that most of this gaseous silicon compound is being exhausted, a portion of it remains and tends to deposit as a silicon compound on the etched surface. To control such deposit, it is the practice to include in the gaseous mixture components that enhance formation of such deposit. This is the role of the helium-oxygen that is mentioned above as included in the exemplary mixture. On the other hand, $NF_3$ and HBr are effective etchants and therefore suppress the deposition.

At a time when the chamber mixture is rich in the etching gases, the trench is etched very efficiently and isotropically, and a relatively wide diameter trench is then being etched. When the gaseous mixture is lean in the etching species, the etching is less efficient and more anisotropic, and a narrower diameter trench is then etched. Essentially what is happening is that as the ratio of the nitrogen trifluoride (the gas component that primarily provides the etching ions) to the helium-oxygen (the gas component that enhances deposition) increases, the etching becomes more isotropic because the etching is primarily chemical. As this ratio decreases, the etching becomes less chemical and more dependent on the physical milling by the largely perpendicular high velocity ions and so more anisotropic.

Moreover, the equilibrium between etch and deposition depends not only on the ratio of the different gas species but also on the wafer temperature T. As T increases, less wall deposition occurs resulting in a more isotropic etch (widening of the trench diameter) and vice versa as T decreases. Therefore, variation of T during processing allows for a corresponding trench profile variation. This phenomenon is used by the invention to form a multiple waste trench, with the advantages discussed. Alternatively, such a profile can be generated by varying the above-mentioned ratio of the gas species of the mixture or/and by varying the chamber pressure. In fact, any combination of these three parameters T, the ratio, and chamber pressure can be used to achieve a multiple waste trench. Since the thermal budget is especially sensitive to the etch mask deterioration, variation of the temperature is the preferred technique since it permits both a significant reduction of the thermal budget and a surface area increase of the trench. However, the invention contemplates use of any one or more of the three possible techniques.

Figure 2:
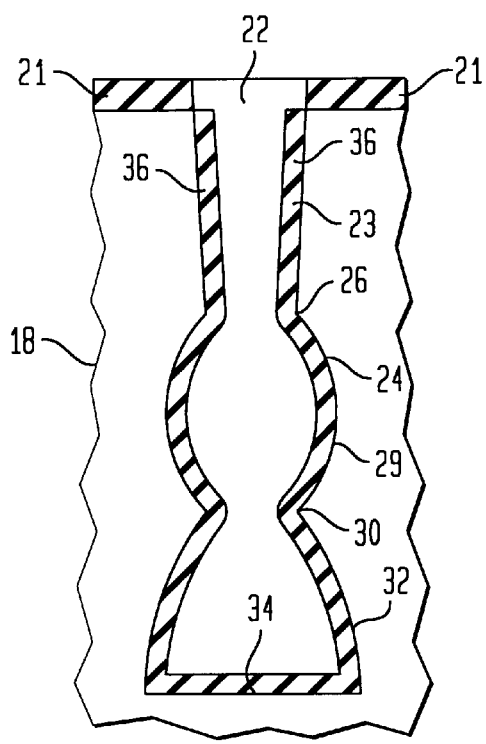
FIG. 2 shows a typical cross-sectional view of a trench that has been etched in accordance with the present invention.

FIG. 2 shows the profile of a typical trench 22 that has been etched by the process novel of the present invention with the parameters set forth in the illustrative example to be described hereinafter.

Figure 3:
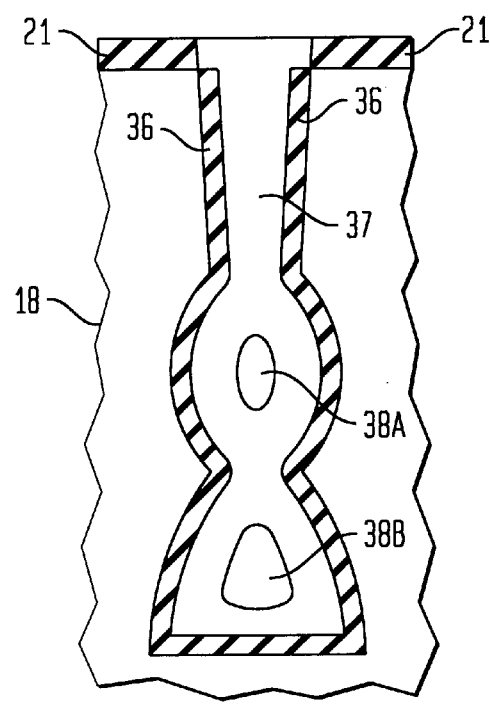
FIG. 3 shows the trench of FIG. 2 after it has been filled with polysilicon.

FIG. 3 shows the trench 22 of FIG. 2 after it has been filled with doped polysilicon 37 to complete its role as a storage capacitor. It is to be noted that voids 38A and 38B typically remain in the polysilicon fill but these have little effect on its role as a plate of the storage capacitor.

Referring now back to FIG. 2, the profile of trench 22 comprises a first slightly-tapered section 23 through a top active region of the wafer 18 in which there are formed the various silicon transistors and shallow oxide isolation trenches that are used to define individual memory cells. This is followed by a second section 24 wherein the taper flares leaving a first waist 26 therebetween. This flare can be extended to provide a width as wide as can be safely used to permit a good fill and to avoid interference with similar adjacent storage capacitors of the DRAM. This is then followed by a section 29 where the taper again reverses direction and the trench narrows, creating a second waist 30 before the taper widens again to form the final section 32. It is found that for a fixed thermal budget, it is possible to achieve a deeper trench depth by a variation up and down in flow rates than with a uniform flow rate of the cooling gases. It is also found that the variations in the trench cross-section, as illustrated in FIG. 2, also provide a larger total surface plate area for the capacitor. These two factors combine to provide an increased capacitance to the trench.

As is known, before the polysilicon is deposited to fill the trench, an insulating layer 36, typically of silicon nitride or silicon oxynitride, is formed over the walls of the trench to serve as the dielectric layer of the capacitor.

It can be seen that the profile of the trench can be characterized as including a double waist. Starting from the top, the initial width of the first section 23 starts out as equal to the size of the opening in the mask. The width of section 23 gradually decreases to form a first waist 26. Thereafter the trench widens over section 24 and reaches a diameter even wider than its initial width. Beyond this in section 29, it narrows again to form a second waist 30 even narrower than that at the first waist 26. Beyond this depth, it widens again over section 32 and expands to a width at its bottom 34 comparable to the maximum reached earlier. The cross-section of the trench 22 typically is ellipsoidal because of the crystalline nature of the wafer 18.

The process that was used to achieve the profile included six steps with the parameters indicated hereinbelow. The parameters include the gas pressure of the gaseous mixture in the chamber that is determined by the flow rates of the various components as indicated: the radio frequency power measured in Watts being applied to create the r-f discharge; the magnetic field in Gauss being maintained in the chamber; the time in seconds of each step; and the pressure of the backside helium being flowed through the base plate for cooling the silicon wafer. By comparing the pressure of the cooling helium gas over the six steps it can be seen that the process involved several changes in the temperature of the silicon wafer 18. It is to be noted that silicon exposed to air typically forms a layer of silicon dioxide ($SiO_2$) thereon which has to be removed (broken through) before etching of the silicon can be achieved.

An illustrative example the steps is as follows:

Step 1) Breakthrough of the $SiO_2$ layer: 20 mTorr/HBr=20 sccm,
$NF_3$=5 sccm/600 W/15 s/6 Torr He backside pressure Step 2) etch 1: 150 mTorr/HBr=110, $NF_3$=16,
He-$O_2$=40/800 W/100 G/110 s/6 Torr He backside pressure Step 3) etch 2: 150 mTorr/HBr=110, $NF_3$=16,
He-$O_2$=26/800 W/100 G/25 s/4 Torr He backside pressure Step 4) etch 3: 150 mTorr/HBr=110, $NF_3$=16,
He-$O_2$=30/1100 W/100 G/145 s/2 Torr He backside pressure Step 5) etch 4: 150 mTorr/HBr=110, $NF_3$=16,
He-$O_2$=30/1100 W/100 G/100 s/10 Torr He backside pressure Step 6) etch 5: 150 mTorr/HBr=110, $NF_3$=16,
He-$O_2$=30/1100 W/100 G/100 s/2 Torr He backside pressure It is to be understood that the gases, their pressures and flow rates for the gaseous components that are ionized, the suppressant gases, and for the cooling gas are merely illustrative and various alternatives are feasible.

The essence of the present invention is variation of temperature of the silicon wafer during the reactive ion etching process in such a manner that the thermal budget available is used in a fashion both to increase the trench depth that can be etched safely and to provide undulations in the trench walls whereby the capacitance available is increased as compared to use of a uniform heating rate using the same heat budget.

What is claimed is:

1. A process of etching a vertical trench in a semiconductive wafer by reactive ion etching to form a part of a trench capacitor comprising the steps of:

supporting the wafer in a plasma-etching chamber through which is flowed a gaseous mixture that includes at least one species that provides reactive ions suitable for etching and another species that serves to enhance the formation of a trench wall coating; and varying the temperature of the wafer during the reactive ion etching process whereby there results a vertical trench whose diameter varies with increasing depth from a first diameter to a wider second diameter, then back to a diameter of essentially the first diameter, and then back to essentially the second diameter, whereby there is formed a trench of larger surface area than would result by maintaining the temperature at a substantially constant value for a fixed thermal budget.

2. The process of claim 1 in which the temperature is increased from an initial value to a second higher value, then decreased back to the initial value, and finally increased to the second value essentially for the remainder of the etching.

* * * * *